(12) United States Patent
Huai et al.

(10) Patent No.: US 11,500,436 B2
(45) Date of Patent: Nov. 15, 2022

(54) SYSTEM AND METHOD FOR PREDICTIVE FAN SPEED CONTROL AND MANAGEMENT

(71) Applicant: DELL PRODUCTS, LP, Round Rock, TX (US)

(72) Inventors: Cho Shih Huai, Linkou District (TW); Hung-Chun Lin, Taipei (TW); Carlos G. Henry, Round Rock, TX (US); Hasnain Shabbir, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 51 days.

(21) Appl. No.: 17/096,083

(22) Filed: Nov. 12, 2020

(65) Prior Publication Data

US 2022/0147125 A1 May 12, 2022

(51) Int. Cl.
*G06F 1/20* (2006.01)
*F04D 27/00* (2006.01)

(52) U.S. Cl.
CPC ........... *G06F 1/206* (2013.01); *F04D 27/004* (2013.01); *G06F 2200/201* (2013.01)

(58) Field of Classification Search
CPC ...................................................... G06F 1/206
USPC ........................................................ 713/300
See application file for complete search history.

(56) References Cited

U.S. PATENT DOCUMENTS

| | | | |
|---|---|---|---|
| 8,190,303 B2 | 5/2012 | Lin et al. | |
| 8,212,501 B2 | 7/2012 | Artman et al. | |
| 9,192,076 B2 | 11/2015 | Artman et al. | |
| 2002/0152406 A1* | 10/2002 | Watts, Jr. | G06F 1/206 713/300 |
| 2012/0292007 A1* | 11/2012 | Chiu | F28D 15/0233 165/247 |
| 2015/0241885 A1* | 8/2015 | Shelnutt | G06F 1/206 700/299 |
| 2016/0102880 A1* | 4/2016 | Lovicott | F24F 11/83 700/300 |
| 2016/0239067 A1* | 8/2016 | Lovicott | G06F 1/206 |
| 2017/0285699 A1* | 10/2017 | Ahuja | G06F 1/3243 |
| 2020/0257343 A1 | 8/2020 | Shabbir et al. | |

* cited by examiner

*Primary Examiner* — Suresh Suryawanshi
(74) *Attorney, Agent, or Firm* — Larson Newman, LLP

(57) ABSTRACT

A management controller is configured to determine a thermal resistance of a heat sink, and determine a thermal resistance curve that includes the thermal resistance. The management controller may also determine a fan speed setting corresponding with the thermal resistance, and set a speed of the fan based on the fan speed setting.

20 Claims, 5 Drawing Sheets

SYSTEM AND METHOD FOR PREDICTIVE FAN SPEED CONTROL AND MANAGEMENT

FIELD OF THE DISCLOSURE

The present disclosure generally relates to information handling systems, and more particularly relates to predictive fan speed control and management.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A management controller may determine a thermal resistance of a heat sink, and determine a thermal resistance curve that includes the thermal resistance. The management controller may also determine a fan speed setting corresponding with the thermal resistance, and set a speed of the fan based on the fan speed setting.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
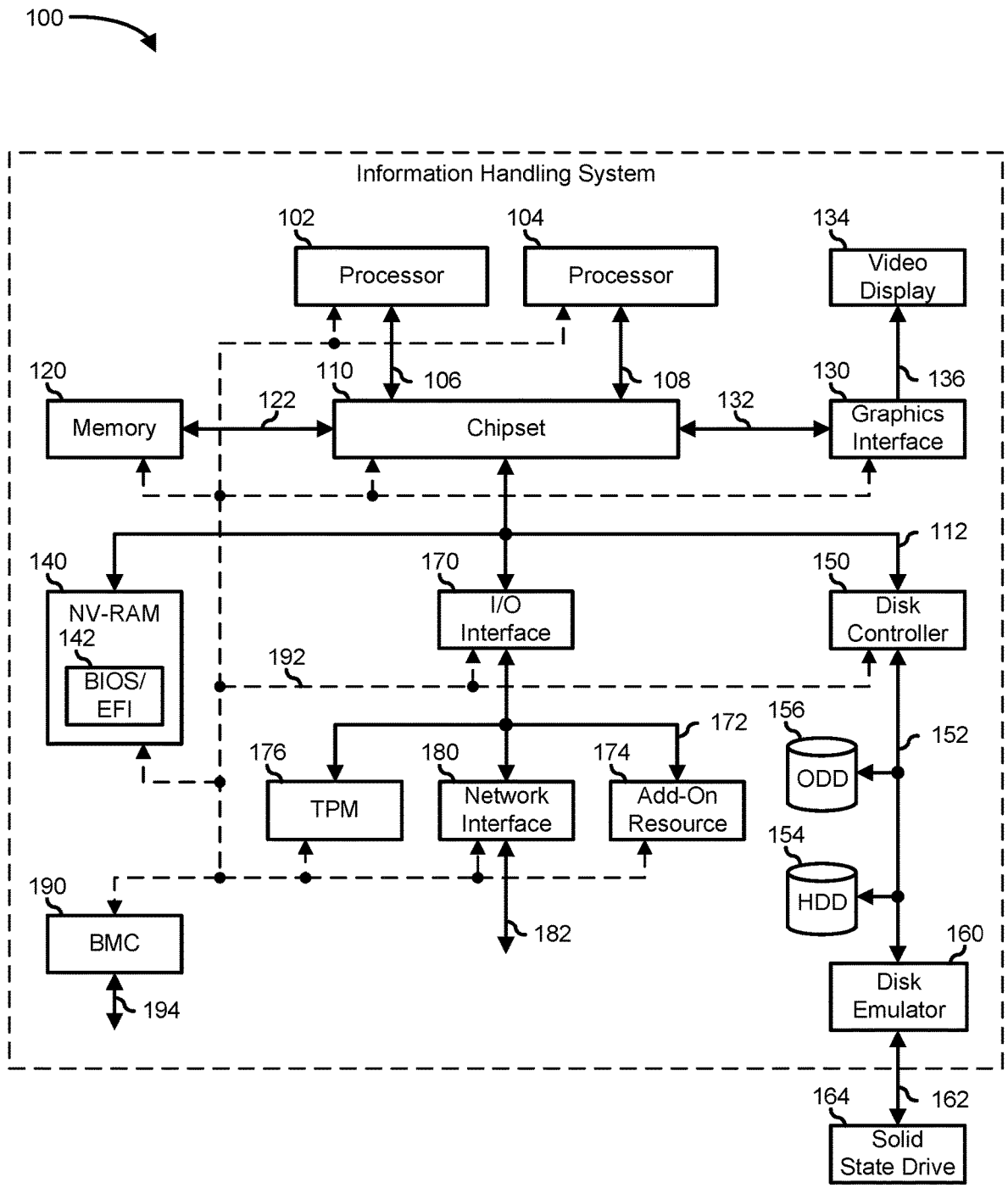
FIG. 1 is a block diagram illustrating an information handling system according to an embodiment of the present disclosure.

FIG. 1 illustrates an embodiment of an information handling system 100 including processors 102 and 104, a chipset 110, a memory 120, a graphics adapter 130 connected to a video display 134, a non-volatile RAM (NV-RAM) 140 that includes a basic input and output system/extensible firmware interface (BIOS/EFI) module 142, a disk controller 150, a hard disk drive (HDD) 154, an optical disk drive 156, a disk emulator 160 connected to a solid-state drive (SSD) 164, an input/output (I/O) interface 170 connected to an add-on resource 174 and a trusted platform module (TPM) 176, a network interface 180, and a baseboard management controller (BMC) 190. Processor 102 is connected to chipset 110 via processor interface 106, and processor 104 is connected to the chipset via processor interface 108. In a particular embodiment, processors 102 and 104 are connected together via a high-capacity coherent fabric, such as a HyperTransport link, a QuickPath Interconnect, or the like. Chipset 110 represents an integrated circuit or group of integrated circuits that manage the data flow between processors 102 and 104 and the other elements of information handling system 100. In a particular embodiment, chipset 110 represents a pair of integrated circuits, such as a northbridge component and a southbridge component. In another embodiment, some or all of the functions and features of chipset 110 are integrated with one or more of processors 102 and 104.

Memory 120 is connected to chipset 110 via a memory interface 122. An example of memory interface 122 includes a Double Data Rate (DDR) memory channel and memory 120 represents one or more DDR Dual In-Line Memory Modules (DIMMs). In a particular embodiment, memory interface 122 represents two or more DDR channels. In another embodiment, one or more of processors 102 and 104 include a memory interface that provides a dedicated memory for the processors. A DDR channel and the connected DDR DIMMs can be in accordance with a particular DDR standard, such as a DDR3 standard, a DDR4 standard, a DDR5 standard, or the like.

Memory 120 may further represent various combinations of memory types, such as Dynamic Random Access Memory (DRAM) DIMMs, Static Random Access Memory (SRAM) DIMMs, non-volatile DIMMs (NV-DIMMs), storage class memory devices, Read-Only Memory (ROM) devices, or the like. Graphics adapter 130 is connected to chipset 110 via a graphics interface 132 and provides a video display output 136 to a video display 134. An example of a graphics interface 132 includes a Peripheral Component Interconnect-Express (PCIe) interface and graphics adapter 130 can include a four lane (x4) PCIe adapter, an eight lane (x8) PCIe adapter, a 16-lane (x16) PCIe adapter, or another configuration, as needed or desired. In a particular embodiment, graphics adapter 130 is provided down on a system printed circuit board (PCB). Video display output 136 can include a Digital Video Interface (DVI), a High-Definition Multimedia Interface (HDMI), a DisplayPort interface, or the like, and video display 134 can include a monitor, a smart television, an embedded display such as a laptop computer display, or the like.

NV-RAM 140, disk controller 150, and I/O interface 170 are connected to chipset 110 via an I/O channel 112. An example of I/O channel 112 includes one or more point-to-point PCIe links between chipset 110 and each of NV-RAM 140, disk controller 150, and I/O interface 170. Chipset 110 can also include one or more other I/O interfaces, including an Industry Standard Architecture (ISA) interface, a Small Computer Serial Interface (SCSI) interface, an Inter-Integrated Circuit (I²C) interface, a System Packet Interface (SPI), a Universal Serial Bus (USB), another interface, or a combination thereof. NV-RAM 140 includes BIOS/EFI module 142 that stores machine-executable code (BIOS/EFI code) that operates to detect the resources of information handling system 100, to provide drivers for the resources, to initialize the resources, and to provide common access mechanisms for the resources. The functions and features of BIOS/EFI module 142 will be further described below.

Disk controller 150 includes a disk interface 152 that connects the disc controller to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits SSD 164 to be connected to information handling system 100 via an external interface 162. An example of external interface 162 includes a USB interface, an institute of electrical and electronics engineers (IEEE) 1394 (Firewire) interface, a proprietary interface, or a combination thereof. Alternatively, SSD 164 can be disposed within information handling system 100.

I/O interface 170 includes a peripheral interface 172 that connects the I/O interface to add-on resource 174, to TPM 176, and to network interface 180. Peripheral interface 172 can be the same type of interface as I/O channel 112 or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral interface 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on separate circuit board or add-in card disposed within information handling system 100, a device that is external to the information handling system, or a combination thereof.

Network interface 180 represents a network communication device disposed within information handling system 100, on a main circuit board of the information handling system, integrated onto another component such as chipset 110, in another suitable location, or a combination thereof. Network interface 180 includes a network channel 182 that provides an interface to devices that are external to information handling system 100. In a particular embodiment, network channel 182 is of a different type than peripheral interface 172 and network interface 180 translates information from a format suitable to the peripheral channel to a format suitable to external devices.

In a particular embodiment, network interface 180 includes a NIC or host bus adapter (HBA), and an example of network channel 182 includes an InfiniBand channel, a Fibre Channel, a Gigabit Ethernet channel, a proprietary channel architecture, or a combination thereof. In another embodiment, network interface 180 includes a wireless communication interface, and network channel 182 includes a Wi-Fi channel, a near-field communication (NFC) channel, a Bluetooth or Bluetooth-Low-Energy (BLE) channel, a cellular based interface such as a Global System for Mobile (GSM) interface, a Code-Division Multiple Access (CDMA) interface, a Universal Mobile Telecommunications System (UMTS) interface, a Long-Term Evolution (LTE) interface, or another cellular based interface, or a combination thereof. Network channel 182 can be connected to an external network resource (not illustrated). The network resource can include another information handling system, a data storage system, another network, a grid management system, another suitable resource, or a combination thereof.

BMC 190 is connected to multiple elements of information handling system 100 via one or more management interface 192 to provide out of band monitoring, maintenance, and control of the elements of the information handling system. As such, BMC 190 represents a processing device different from processor 102 and processor 104, which provides various management functions for information handling system 100. For example, BMC 190 may be responsible for power management, cooling management, and the like. The term BMC is often used in the context of server systems, while in a consumer-level device a BMC may be referred to as an embedded controller (EC). A BMC included at a data storage system can be referred to as a storage enclosure processor. A BMC included at a chassis of a blade server can be referred to as a chassis management controller and embedded controllers included at the blades of the blade server can be referred to as blade management controllers. Capabilities and functions provided by BMC 190 can vary considerably based on the type of information handling system. BMC 190 can operate in accordance with an Intelligent Platform Management Interface (IPMI). Examples of BMC 190 include an Integrated Dell® Remote Access Controller (iDRAC).

Management interface 192 represents one or more out-of-band communication interfaces between BMC 190 and the elements of information handling system 100, and can include an Inter-Integrated Circuit (I2C) bus, a System Management Bus (SMBUS), a Power Management Bus (PMBUS), a Low Pin Count (LPC) interface, a serial bus such as a Universal Serial Bus (USB) or a Serial Peripheral Interface (SPI), a network interface such as an Ethernet interface, a high-speed serial data link such as a Peripheral Component Interconnect-Express (PCIe) interface, a Network Controller Sideband Interface (NC-SI), or the like. As used herein, out-of-band access refers to operations performed apart from a BIOS/operating system execution environment on information handling system 100, that is apart from the execution of code by processors 102 and 104 and procedures that are implemented on the information handling system in response to the executed code.

BMC 190 operates to monitor and maintain system firmware, such as code stored in BIOS/EFI module 142, option ROMs for graphics adapter 130, disk controller 150, add-on resource 174, network interface 180, or other elements of information handling system 100, as needed or desired. In particular, BMC 190 includes a network interface 194 that can be connected to a remote management system to receive firmware updates, as needed or desired. Here, BMC 190 receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image.

BMC 190 utilizes various protocols and application programming interfaces (APIs) to direct and control the processes for monitoring and maintaining the system firmware. An example of a protocol or API for monitoring and maintaining the system firmware includes a graphical user interface (GUI) associated with BMC 190, an interface defined by the Distributed Management Taskforce (DMTF) (such as a Web Services Management (WSMan) interface, a Management Component Transport Protocol (MCTP) or, a Redfish® interface), various vendor defined interfaces (such as a Dell EMC Remote Access Controller Administrator (RACADM) utility, a Dell EMC OpenManage Enterprise, a Dell EMC OpenManage Server Administrator (OMSS) utility, a Dell EMC OpenManage Storage Services (OMSS) utility, or a Dell EMC OpenManage Deployment Toolkit (DTK) suite), a BIOS setup utility such as invoked by a "F2" boot option, or another protocol or API, as needed or desired.

In a particular embodiment, BMC 190 is included on a main circuit board (such as a baseboard, a motherboard, or any combination thereof) of information handling system 100 or is integrated onto another element of the information handling system such as chipset 110, or another suitable element, as needed or desired. As such, BMC 190 can be part of an integrated circuit or a chipset within information handling system 100. An example of BMC 190 includes an iDRAC, or the like. BMC 190 may operate on a separate power plane from other resources in information handling system 100. Thus BMC 190 can communicate with the management system via network interface 194 while the resources of information handling system 100 are powered off. Here, information can be sent from the management system to BMC 190 and the information can be stored in a RAM or NV-RAM associated with the BMC. Information stored in the RAM may be lost after power-down of the power plane for BMC 190, while information stored in the NV-RAM may be saved through a power-down/power-up cycle of the power plane for the BMC.

Information handling system 100 can include additional components and additional busses, not shown for clarity. For example, information handling system 100 can include multiple processor cores, audio devices, and the like. While a particular arrangement of bus technologies and interconnections is illustrated for the purpose of example, one of skill in the art will appreciate that the techniques disclosed herein are applicable to other system architectures. Information handling system 100 can include multiple central processing units (CPUs) and redundant bus controllers. One or more components can be integrated together. Information handling system 100 can include additional buses and bus protocols, for example, I2C and the like. Additional components of information handling system 100 can include one or more storage devices that can store machine-executable code, one or more communications ports for communicating with external devices, and various input and output (I/O) devices, such as a keyboard, a mouse, and a video display.

For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smartphone, a tablet device or other consumer electronic device, a network server, a network storage device, a switch, a router, or another network communication device, or any other suitable device and may vary in size, shape, performance, functionality, and price. Further, information handling system 100 can include processing resources for executing machine-executable code, such as processor 102, a programmable logic array (PLA), an embedded device such as a System-on-a-Chip (SoC), or other control logic hardware. Information handling system 100 can also include one or more computer-readable media for storing machine-executable code, such as software or data.

A data center is a facility used to house information handling systems and associated components. The data center can include hundreds or thousands of individual information handling systems, such as servers, data storage devices, network devices, and the like. During operation, these information handling systems can generate considerable heat that should be dissipated to ensure optimal performance and reliability. Each of the information handling systems typically includes one or more fans to draw in cool air from the data center environment and exhaust warm air, having extracted heat from heat-generating components of the information handling system, such as processors also referred herein as CPUs.

Because power consumed to cool the servers, data storage devices, network devices, and the like can be significant contributor to the energy consumption, fan control and management systems and methods are used for airflow management that minimizes power consumption. Fan speed control and management systems and methods generally operate fans to optimize thermal performance at the lowest possible fan speed in order to reduce noise. However, typical fan speed control and management systems and methods, such as proportional integral differential (PID) closed-loop control systems, have not resolved some issues like fan speed oscillation and temperature overshoot during a processor transient stage because these fan speed control and management systems are reactive to the condition of the processor, heat sink or other components of the information handling system. The present disclosure addresses these issues by providing flexible fan speed control and management that predicts a target fan speed which helps stabilize the fan speed in steady state and may eliminate temperature overshoot and fan speed oscillation.

Figure 2:
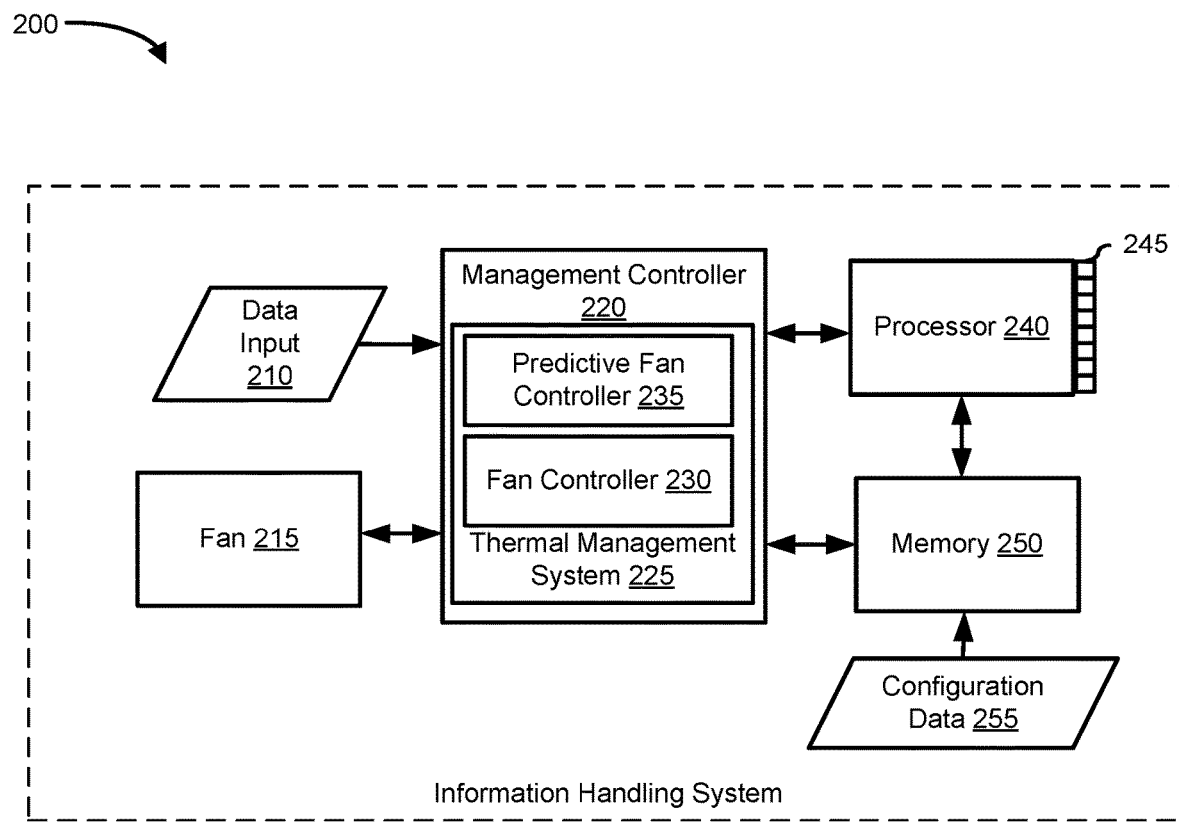
FIG. 2 is a block diagram illustrating an example of a system for predictive fan speed control and management, according to an embodiment of the present disclosure.

FIG. 2 shows an example of an information handling system 200 with system for predictive fan speed control and management also referred to as predictive thermal management system. Information handling system 200 includes a fan 215, a management controller 220, a processor 240, a heat sink 245, and a memory 250. Management controller 220 includes a thermal management system 225 which includes a fan controller 230 and a predictive fan controller 235.

Information handling system 200, which is similar to information handling system 100 of FIG. 1, may be configured in one of a plurality of configurations. For example, information handling system 200 may have a first form factor which is different from a second information handling system with a second form factor. Information handling system 200 may have a different storage density than the second information handling system. Information handling system 200 may include a first plurality of storage elements or drives which may be hard drives having a 3.5-inch configuration and the second information handling system may have a plurality of hard drives having a 2.5-inch form factor. The storage drives may include magnetic hard drives, optical hard drives, solid state drives or the like which may be collectively referred to herein as simply drives. With higher the storage density, pathways for airflow through each row of drive assemblies may be fewer as gaps between drives may be narrower. In addition, front row drives may receive better airflow than drives toward the rear of an enclosure, which may also receive pre-heated air that has already flowed across the previous row(s) of drives in the enclosure. This results in different heat sink thermal resistance requirements and accordingly different fan speed requirements to cool information handling systems with different configurations. The aforementioned configuration data, such as number and type of hard disk drives may be included a configuration data 255. Configuration data may also information associated with a chassis type of the information handling system, a type of fan 215, type of processor 240, type of heat sink 245, etc.

Information handling system 200 may include one or more fans such as fan 215. Fan 215 may be any mechanical or electro-mechanical device used for cooling purposes of an information handling system. Fan 215 may be a cooling fan, a blower, or any other device that moves air to cool down information handling system 205. Fan 215 may be included in the chassis of information handling system used to exhaust heat from the chassis. The operation of cooling fan 215 may be managed by thermal management system 225. Thermal management system 225 may be configured to maintain temperatures within processor operating limits which includes controlling the speed of fan 215. Thermal management system 225 may include any hardware, software, and/or firmware operable to control and manage the speed of fan 215 based data input 210, a heat sink thermal resistance curve, and configuration data 255 which may be stored in memory 250. Memory 250 may be a non-volatile memory similar to NV-RAM 140 of FIG. 1. In one embodiment, thermal management system 225 may be included in management controller 220, which may be similar to BMC 190, and coupled to processor 240.

Processor 240 may be similar to processor 102 and/or processor 104 of FIG. 1. Processor 240 may operate at a high frequency for a short period of time. For example, Intel® processors may use Intel Turbo Boost Technology, which allows the processors to operate at very high frequency for a short amount of time. When processor 240 is operating at or near its maximum frequency it's possible for the temperature to climb very rapidly and quickly reach its maximum temperature. This may result in overheat or temperature overshoot and/or fan oscillation. In sustained workloads, it is possible processor 240 will operate at or near its maximum temperature limit.

Management controller 220 may be configured to monitor the temperature of processor 240 and adjust or control the speed of fan 215 to prevent overheating and damage of processor 240 via thermal management system 225. Management controller 220 may also be configured to prevent temperature overshoot and/or fan oscillation. In addition, management controller 220 may be configured to perform temperature measurements, and perform calculations such as to calculate thermal resistance values and fan speeds. Based on the measurements, management controller 220 may be configured to generate a thermal resistance curve based on the thermal resistance values and the fan speeds. Management controller 220 may also determine different thermal resistance curves corresponding to different configurations of information handling system(s). Management controller 220 may then set the speed of fan 215 based on a corresponding fan speed of a thermal resistance value in a thermal resistance curve.

Fan controller 230 may employ one of various traditional thermal management system and method also referred to as conventional fan control mechanisms such as the PID closed-loop control system or an adaptive closed loop thermal control system by Dell. Typically, the PID closed-loop control system is based on a mathematical equation summing proportional, integral, and differential terms of the cooling fan speed being controlled. While the adaptive closed loop thermal control system applies fuzzy logic rules to PID closed-loop control system control inputs.

Predictive fan controller 235 may be configured to work in conjunction with fan controller 230 in managing temperature of information handling system 200 by managing power and speed of fan 215. Predictive fan controller 235 may be configured to control fan power and/or fan speed of fan 215 as a function of the heat sink thermal resistance, wherein the function considers power consumption, a target temperature, and inlet temperature also referred to as ambient temperature. The heat sink thermal resistance with pulse width modulation (PWM) may be used to provide a reference fan speed or target fan speed during the power ramping stage of the processor which may prevent temperature overshoot and/or fan speed oscillation. After determining the reference fan speed or target fan speed, predictive fan controller 235 may hand off the control and management to fan controller 230.

Heat sink 245 may be used to improve heat dissipation of processor 240. A heat sink with a small thermal resistance effectively helps protect a component against overheating, where thermal resistance is the measure of substance's ability to dissipate heat. Thermal resistance is defined as temperature rise per unit of power and is expressed in units of degrees Celsius per watt (° C./W). The target thermal resistance also referred herein as heat sink thermal resistance may be affected by the inlet temperature, which is the temperature of the airflow passing through the heat sink. Management controller 220 and/or processor 240 can be used to calculate the thermal resistance of heat sink 245 which is impacted by the airflow passing through heat sink 245. The thermal resistance of processor 240 may be calculated using equation (1) below:

$$\text{Theta } hs = (\text{Processor Temperature} - \text{Inlet Temperature})/\text{Processor Power}$$

Processor temperature may be a temperature at the integrated circuit die of processor 240 provided by a thermal sensor. Processor temperature may also be a target temperature of processor 240. Inlet temperature, also referred to as ambient temperature, is a temperature of air circulating through heat sink 245 or processor 240 that can be determined by another thermal sensor. Processor power is a product of voltage and current supplied to processor 240 during operation. Processor power can be regulated based on controlling a computational workload at processor 240. Alternatively, other heat generating components that include a thermal sensor and some form of heat sink, for example memory 250, and the like, may be utilized. Accordingly, the disclosed techniques can be implemented without adding components to information handling system 200.

Figure 4:
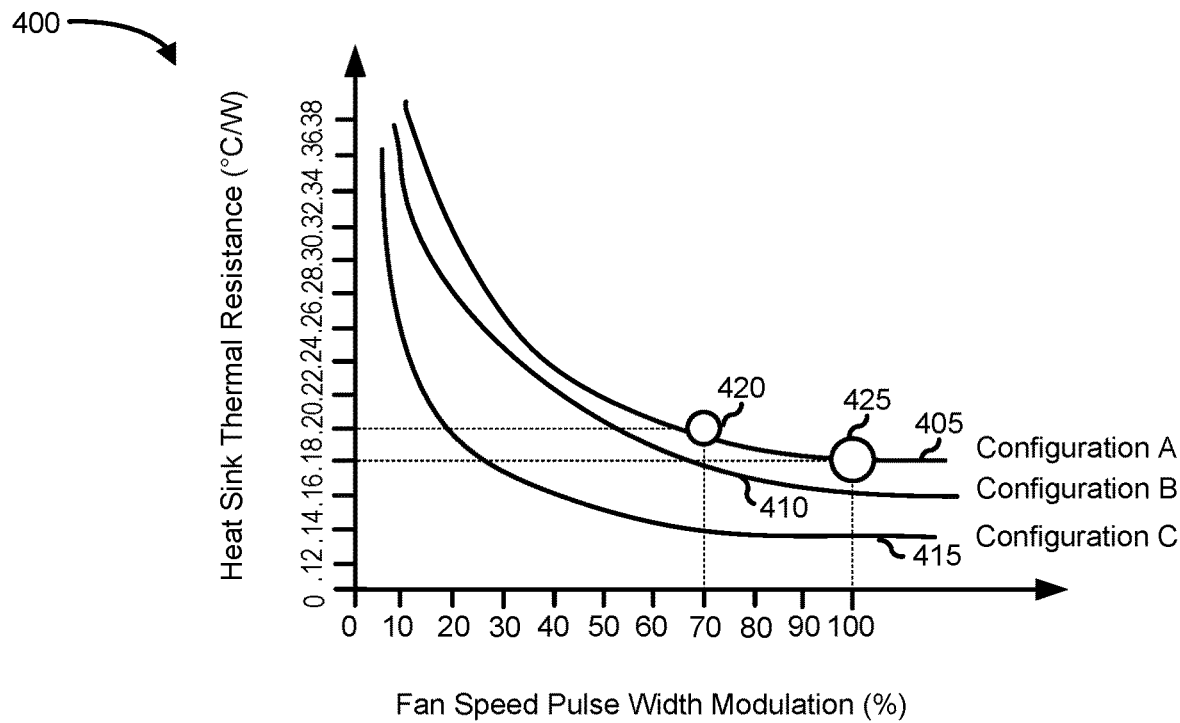
FIG. 4 is a function diagram illustrating an association of a heat sink thermal resistance with fan speed, according to an embodiment of the present disclosure.

The thermal resistance of processor 240 which is associated with heat sink 245 is characterized as a function of operating speed of fan 215. The function may be characterized as a thermal resistance curve as depicted in FIG. 4 which may be stored in memory 250. The thermal resistance curve may also be determined based on configuration data 255 of information handling system 200 which may be stored in memory 250. The thermal resistance curve may be characterized in terms of different chassis, components, and fan types during the manufacture of the information handling system and other information. The information used in various calculations may be included in data input 210.

Data input 210 may include various information associated with the components of information handling system such as identifier, type, speed, capacity, processor temperature, inlet temperature power consumption of processor 240, etc. Data input 210 may be collected by BIOS and transmitted to management controller 220 which may be used to determine the setting of the reference fan speed or the target fan speed of fan 215.

Figure 3:
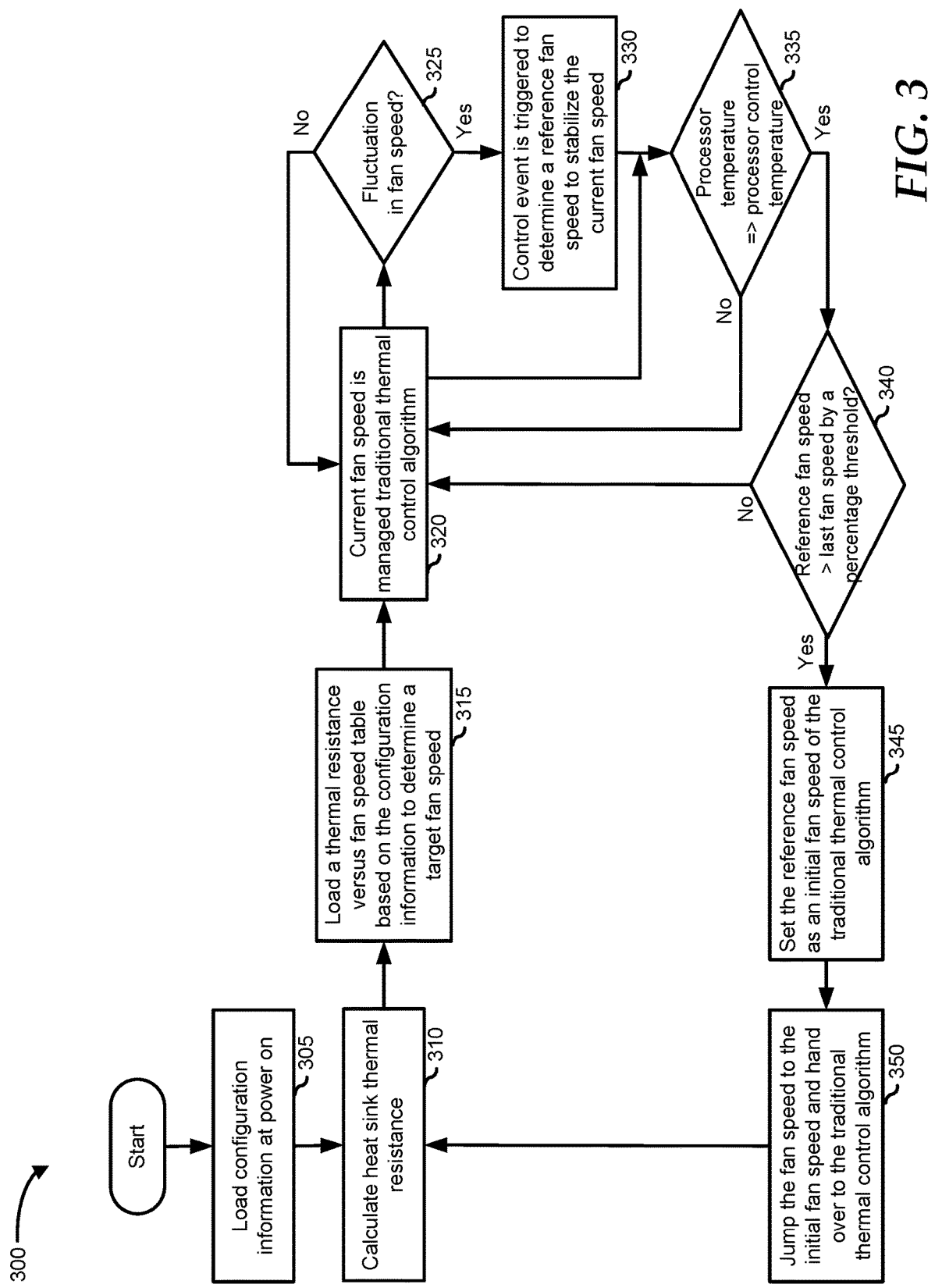
FIG. 3 is a flowchart illustrating an example of a method for predictive fan speed control and management, according to an embodiment of the present disclosure.

FIG. 3 illustrates a method 300 for performing predictive thermal management system. While embodiments of the present disclosure are described in terms of information handling system 200 of FIG. 2, it should be recognized that other systems may be utilized to perform the described method. In particular, method 300 may be performed by management controller 220 of FIG. 2.

Method 300 typically starts at block 305, where the method loads configuration data of an information handling system at power on. The configuration data may be retrieved by or received from the BIOS. The configuration data may include information such as performance settings, chassis configuration, and component population, etc. Method 300 may be used in managing processor temperature which is intended to support acoustic noise reduction through fan speed control and to assure processor reliability. Selection of the appropriate fan speed may be based on the heat sink thermal resistance and the configuration data. Method 300 may be used to determine the target fan speed resulting in minimal temperature overshoot and fan oscillation.

The method proceeds to block 310, where the method calculates the heat sink thermal resistance, such as a target heat sink thermal resistance. Prior to calculating the heat sink thermal resistance, the method retrieves a target temperature of the processor, the inlet temperature, and the processor power. The method may also receive the aforementioned information from the BIOS.

Figure 5:
FIG. 5 is a table illustrating an association of a heat sink thermal resistance with fan speed, according to an embodiment of the present disclosure.

The method proceeds to block 315, the method loads a thermal resistance versus fan speed table similar to table 500 of FIG. 5. The values in the aforementioned table may be mapped to the values with that of a thermal resistance curve of graph 400 of FIG. 4. The method may load the table and/or the thermal resistance curve based on the detected configuration of the information handling system. The method may use the values in the table to determine the fan speed, also referred to as a target fan speed based on the value of the calculated heat sink thermal resistance. The management controller and/or fan control may adjust the speed of the fan based on the determined fan speed value.

After adjusting the speed to the target fan speed, the method proceeds to block 320, where the method hands off the thermal management to the traditional thermal management system and method, also referred to as traditional thermal management algorithm such as the PID or the adaptive closed loop thermal control system. The method may take control from the traditional thermal management algorithm based on a set of criteria such as shown in decision block 325, decision block 335, and decision block 340. One skilled in the art will appreciate that the method may take control based fewer criteria, additional criteria, or different criteria as shown.

The method may proceed to decision block 325 and decision block 335. For example, the method may use the traditional thermal management algorithm for a particular period before determining if there is a temperature overshoot or fan oscillation issue and transfer control to the predictive thermal management system to stabilize the processor temperature and fan speed.

At decision block 325, the method determines if there is a fluctuation in the speed of the fan. If the method determines that there is a fluctuation, that is oscillation, in the fan speed, then the "YES" branch is taken and the method proceeds to block 330. If the method determines that there is no fluctuation in the fan speed, then the "NO" branch is taken and the method proceeds to block 320. At block 330, a control event will be triggered to determine a reference fan speed also referred to as a reference fan speed setting to stabilize the speed of the fan. The reference fan speed may be based on the TDP of the processor which is the average value the processor can sustain. The TDP is generally measured under a worst-case load with all processor cores active. The control event may be transmitted to a predictive fan controller. The reference fan speed may be the target fan speed which is used as a reference speed in fan control management.

The method proceeds to decision block 335, where the method determines whether the processor is stressing, that is where the processor power consumption is ramping up or increasing. The method may also determine whether the current processor temperature hits a processor control temperature. The processor control temperature is an upper bound processor temperature threshold which may be used a trigger point for fan speed control. The BIOS can retrieve the processor control temperature which may vary based on the processor and/or BIOS settings.

The method may generate an interrupt if the control temperature is reached. The control temperature may be set by the manufacturer of the processor. As the processor heats up, the gap between the current processor temperature and the processor control temperature control may be lessened. If the method determines that the processor power is ramping up and/or processor temperature is equal or greater than the processor control temperature, then the "YES" branch is taken and the method proceeds to decision block 340. If the method determines that the processor power is not ramping up and/or the current processor temperature is less than the processor control temperature then the method proceeds to block 320.

One of skill in the art will appreciate that another threshold may be used in addition or instead of the processor temperature such as processor voltage, processor power, etc. For example, the method may use a maximum power threshold, wherein the processor power is compared with the maximum power threshold. If the processor power is equal or greater than the maximum power threshold, then the method may generate an interrupt and proceed to decision block 340. Upon detecting the interrupt, the method may determine the last fan speed and a percentage threshold value associated with the fan speed. The percentage threshold value may be a maximum percentage value of a change between two fan speeds. The percentage threshold value may be set at the manufacturer of the information handling system and/or an administrator of the information handling system. If the processor power is not equal or greater than the maximum power threshold, then the method may proceed to block 320.

At decision block 340, the method determines if the reference fan speed is greater than the last or current fan speed by the percentage threshold value. For example, the percentage threshold value may be set to 40%. If the reference fan speed is greater than the last or current fan speed by the percentage threshold value, then the "YES" branch is taken and the method proceeds to block 345. If the reference fan speed is not greater than the last or current fan speed by the percentage threshold value, then the "NO" branch is taken and the method proceeds to block 320.

At block 345, the method sets the reference fan speed as the initial fan speed setting of the traditional thermal management algorithm. The method proceeds to block 350 where the method jumps the fan speed to the initial fan speed setting and hands over control of the current fan speed to the traditional thermal management algorithm. The method manages the next speed of the next fan if available. Otherwise, the method continues managing the speed of the current fan. The method proceeds to block 310.

FIG. 4 is a graph 400 showing examples of heat sink thermal resistance curves. Graph 400 includes a horizontal axis representing fan speed PWM in units of percentage values and a vertical axis representing heat sink thermal resistance in units of degrees Centigrade per watt. Graph 400 also includes a thermal resistance curve 405, a thermal resistance curve 410, and a thermal resistance curve 415. In addition, graph 400 also includes a data point 420 and a data point 425.

Each one of the heat sink thermal resistance curves shows the relationship between heat sink thermal resistance and fan speed. The management controller may retrieve measurements such as temperatures and processor power to calculate a thermal resistance of a system component such as the processor. The calculation may be based on equation (1) above. The management controller may also receive the measurements from various sensors via the BIOS. The measurements may be used to determine the relationship between the fan speed and the thermal resistance. The relationship may be expressed as function of the heat sink thermal resistance versus fan speed. The relationship between the fan speed and the heat sink thermal resistance based on properties of the thermal resistance curve such as its slope.

Fan speed may be represented by PWM or by duty cycle. Generally, PWM may be a measurement of power to electrical devices. For example, the longer a switch is on compared to off periods, the higher the power supplied to the load. A fully on period may be expressed as 100%. The duty cycle may refer to a portion of "on" time in relation to a set time period, and may be represented as a percentage. A duty cycle of 100% may refer to a fan that is fully on. In other examples, fan speed may be measured by revolutions per minute (RPM).

Each thermal resistance curve is associated with a different configuration of an information handling system. For example, thermal resistance curve 405 is associated with configuration A which may include 12 hard drives having a 3.5-inch configuration. While thermal resistance curve 410 is associated with configuration B which may include 24 hard drives having a 2.5-inch configuration and thermal resistance curve 415 is associated with configuration C which may include 8 hard drives having 3.5-inch configuration. The configuration may also include the type of chassis, fan type, number of processors, etc.

Data point 420 is an intersection between a value of the heat sink thermal resistance and the fan speed at thermal resistance curve 405. Similarly, data point 425 is an intersection between a value of the heat sink thermal resistance and the fan speed at thermal resistance curve 405. After calculating the heat sink thermal resistance, the management controller can determine the corresponding fan speed based on the heat sink thermal resistance curve. Here, if the information handling system is configured based on configuration A, then the applicable heat sink thermal resistance curve is thermal resistance curve 405. If the heat sink thermal resistance is calculated as 0.20 based on equation (1) above, then the corresponding fan speed is 70% PWM as shown by data point 420. If the heat sink thermal resistance is calculated as 0.18 based on equation (1) above, then the corresponding fan speed is 100% PWM as shown by data point 425. The management controller may "jump" to the corresponding fan speed above which is the target fan speed. Jumping to the target fan speed directly instead of iterating through various fan speeds may address the temperature overshoot and fan oscillation issues.

The thermal resistance curves for the different configurations may be generated at a manufacturer of the information handling system based on tests performed on the information handling system. Configuration data along with information related to the thermal resistance curves may be stored at a memory device associated with the management controller. The thermal resistance curve may be stored as a set of values in a table similar to table 500 in FIG. 5.

FIG. 5 shows a table 500 of thermal resistance calculations and corresponding target fan speeds based on various configurations of an information handling system as depicted in graph 400 of FIG. 4. Table 500 includes four columns and several rows. The columns include a configuration unique identifier, a configuration description, heat sink thermal resistance, and fan speed. The table may include additional columns such as processor temperature, ambient temperature, and processor power. The rows show the corresponding fan speed for each heat sink thermal resistance based on particular information handling system configuration.

The management controller can control the speed of a fan as determined by the heat sink thermal resistance according to the values in table 500. The heat sink thermal resistance may be calculated by the management controller based on the processor temperature and the ambient temperature as determined by a thermal sensor. The thermal resistance can be calculated using equation (1) above. The fan speed may be based on the thermal resistance curve as shown in FIG. 4. Here, the fan speed is shown for various heat sink thermal resistances associated with a particular configuration. For example, the corresponding fan speed for heat sink thermal resistance of 0.02 associated with heat sink thermal resistance curve identifier 0001 is 15% PWM. The corresponding fan speed for heat sink thermal resistance of 0.20 associated with heat sink thermal resistance curve identifier 0001 is 100% PWM, similar to data point 425 of FIG. 4. One of skill in the art will appreciate that another value for heat sink thermal resistance and corresponding fan speeds may be determined based on other configuration values and/or data.

Figure 6:
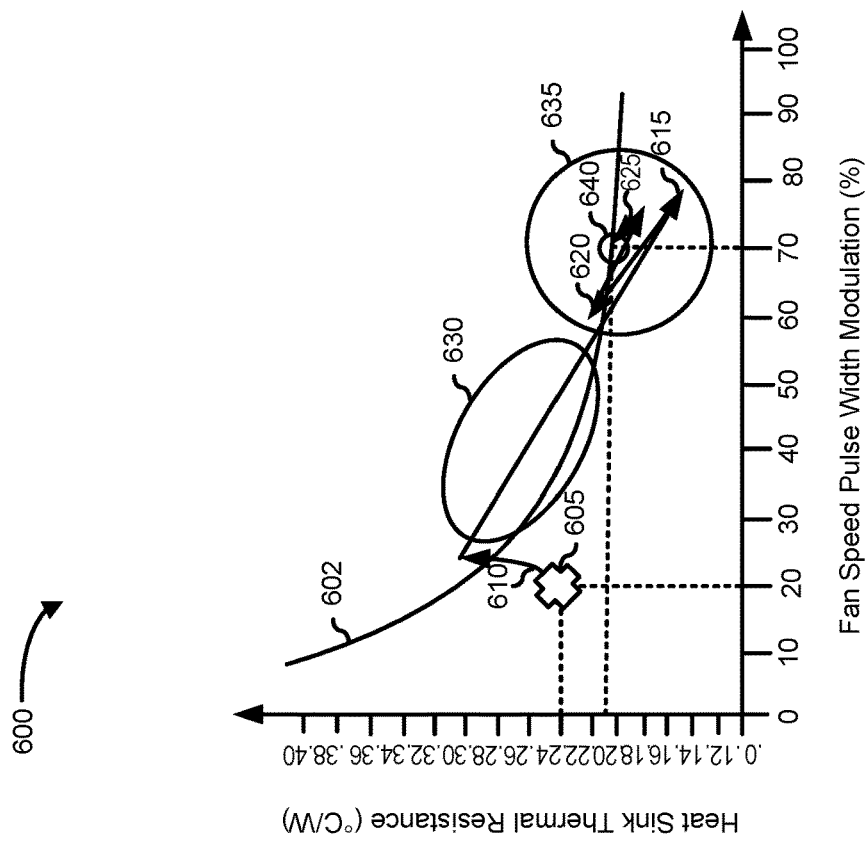
FIG. 6 is a function diagram illustrating a temperature overshoot and fan speed oscillation with a traditional thermal management system and method, according to an embodiment of the present disclosure.

FIG. 6 is a graph 600 showing an example of traditional thermal management system and method also referred to as conventional fan speed algorithm, such as the PID closed-loop control system. Graph 600 includes curve 602 illustrating a thermal resistance of the heat sink over a range of possible fan speeds. Curve 602 is a heat sink thermal resistance target curve which shows the ideal fan speed for a heat sink thermal resistance based on a configuration of an information handling system. At data point 605, the heat sink thermal resistance is at 0.24° C./W with a corresponding fan speed at 20% PWM. The conventional algorithm typically looks for a temperature change periodically and adjusts the fan speed accordingly. The conventional algorithm may also adjust the fan speed if no temperature update is received. Line 610 shows the fan speed changed to approximately 25% PWM. Subsequently after a certain period, the fan speed is changed to approximately 78% PWM as shown by line 615. Overshoot 630 shows the temperature overshoot during a transient stage, where a portion of line 615 is above curve 602.

Thereafter, after another period, the fan speed is changed to approximately 60% PWM as shown by line 620 and to 70% PWM as shown by line 625. Fan speed oscillation 635 shows the fan speed oscillation before it reaches the target fan speed of 70% PWM corresponding to thermal resistance of approximately 0.21° C./W as shown by data point 640. Oscillation occurs when a controller of the conventional fan speed algorithm repeatedly makes fan speed changes that are larger than a certain threshold. The oscillation may be audibly noticeable to an end user. For example, as shown, the fan had different fan speeds from approximately 78% PWM to approximately 60% PWM, a difference of 18% PWM or a 23% change. The fan speed changed from 60% PWM to 75% PWM, a difference of 15% PWM or a 25% change before reaching target fan speed of 70% PWM.

Figure 7:
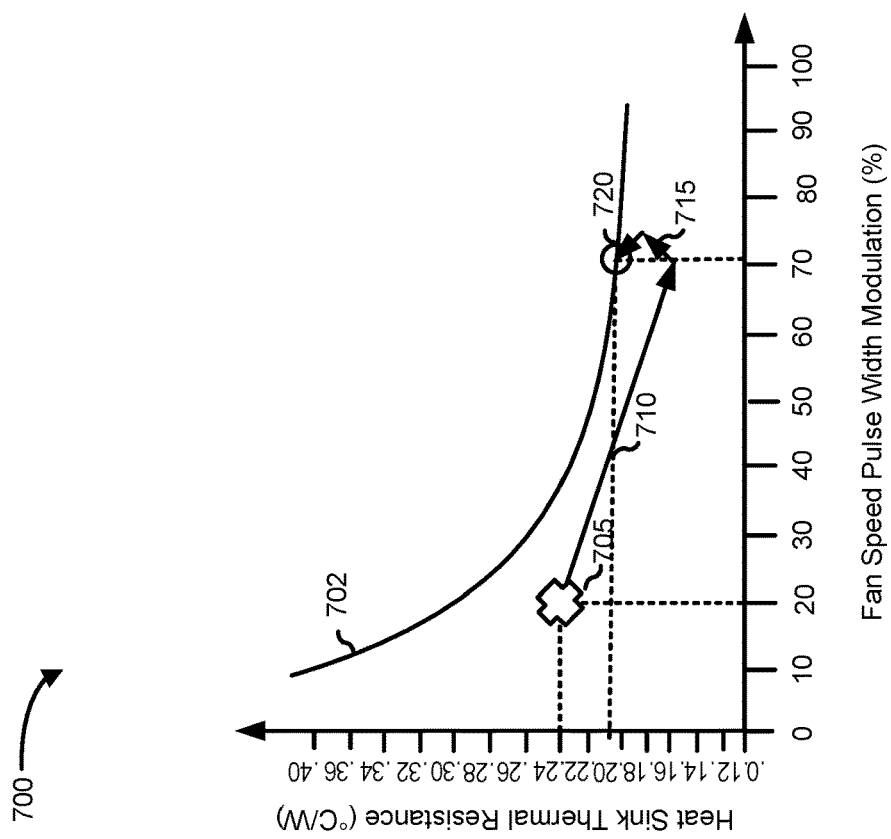
FIG. 7 is a function diagram illustrating temperature management and fan speed stability with predictive fan speed control system and method, according to an embodiment of the present disclosure.

FIG. 7 shows a graph 700 which is an example of fan speed control using the predictive fan speed control algorithm utilized by the predictive thermal management system. Graph 700 includes a curve 702 which is similar to curve 602 of FIG. 6. At data point 705, the heat sink thermal resistance is 0.24° C./W and the corresponding fan speed is at 20% PWM. Here, the data point 705 may be a reference data point or a current data point reflecting an initial thermal resistance while data point 720 is a target data point. Instead of adjusting the fan speed based on data point 705 as shown in line 610 of graph 600 of FIG. 6, the predictive fan speed control algorithm adjusts the fan speed to the target fan speed as shown in line 710.

In order to determine the target fan speed, the predictive fan speed control algorithm may first determine the target thermal resistance of the heat sink. The target thermal resistance of the heat sink may be based on a thermal resistance curve which may be nonlinear. The thermal resistance curve may have been predetermined by the manufacturer of the information handling system based on the configuration of the information handling system. As shown, the slope of the thermal resistance curve is steeper at data point 705 than at data point 720, wherein the thermal resistance is stabilizing. Data point 720 may correspond to a target thermal resistance and corresponding fan speed wherein the thermal resistance and/or fan speed is stabilizing. Here, the target fan speed is 70% PWM based on thermal resistance of 0.21° C./W as shown by data point 720. The target thermal resistance may be calculated based on a target processor temperature, the inlet temperature, and the processor power as shown in equation (1) above.

The target temperature may be a temperature wherein the processor can safely operate over a long period of time which may be based on various factors such as a processor type. Typically the target temperature can be read by the BIOS via a processor interface and transmitted to the management controller. After determining the target thermal resistance, the target fan speed may be determined as a function of the target thermal resistance which based on the thermal resistance curve such as curve 702, which may be nonlinear. Similar to curve 602, curve 702 is based on a configuration of an information handling system. After determining the target fan speed, the predictive speed control algorithm sets the fan speed to the target speed. After setting the fan speed to the target fan speed, the predictive fan speed algorithm transfers control to a conventional fan speed algorithm. In this example, the predictive speed control algorithm sets the fan speed to the target fan speed is 70% PWM and transfers the control to the conventional fan speed algorithm. The conventional fan speed algorithm may change the fan speed based on a change in temperature or other factors. Here, the fan speed was changed to approximately 73% PWM a change of 3% PWM before changing back to 70% PWM which is another change of 3% PWM which is about 4% change before reaching the target speed of 70% PWM. As shown, the fan oscillation is reduced in the present disclosure in contrast to the fan oscillation of a conventional fan speed algorithm.

Although exemplary embodiments show one fan and one processor, a person skilled in the art will readily appreciate that in some embodiments, an information handling system may have more than one processor and more than one fan. In addition, more than one fan may be coupled to each processor and/or various components of the information handling system in the chassis. In addition, or alternatively, one or more cooling fans may be used to cool multiple or all of the processors in the chassis.

In addition, although embodiments show a management controller performing thermal control and management of various components of an information handling system such as the processor, a person skilled in the art will readily appreciate that in some embodiments, the management controller may be a chassis management controller that performs thermal control and management of more than one information handling systems.

Although only a few exemplary embodiments have been described in detail above, those skilled in the art will readily appreciate that many modifications are possible in the exemplary embodiments without materially departing from the novel teachings and advantages of the embodiments of the present disclosure.

Although FIG. 3 shows example blocks of method 300 in some implementation, method 300 may include additional blocks, fewer blocks, different blocks, or differently arranged blocks than those depicted in FIG. 3. Additionally, or alternatively, two or more of the blocks of method 300 may be performed in parallel. For example, block 345 and block 350 may be performed in parallel.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionalities as described herein.

The present disclosure contemplates a computer-readable medium that includes instructions or receives and executes instructions responsive to a propagated signal; so that a device connected to a network can communicate voice, video or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or another storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents but also equivalent structures.

What is claimed is:

1. A method comprising:
   determining, by a management controller, a thermal resistance of a heat sink associated with a processor in an information handling system;
   determining a thermal resistance curve that includes the thermal resistance of the heat sink associated with the processor, wherein the thermal resistance curve is influenced by a configuration of the information handling system;
   determining a fan speed setting corresponding to the thermal resistance of the heat sink, wherein the fan speed setting is a function of the thermal resistance based on the thermal resistance curve:
   in response to determining that there is a fan oscillation issue, triggering a control event to determine a target fan speed;
   in response to determining that a current temperature of the process is equal to a control temperature, determining whether the fan speed setting is greater than a previous fan speed setting by more than a threshold percentage value; and
   in response to determining that the fan speed setting is greater than the previous fan speed setting, setting the fan speed setting equal to the target fan speed.

2. The method of claim 1, further comprising determining whether a set of criteria is met prior to setting the fan speed setting equal to the target fan speed.

3. The method of claim 2, wherein the set of criteria includes determining whether the current temperature of the processor is greater than the control temperature.

4. The method of claim 2, wherein the set of criteria includes-determining whether the fan oscillation issue exists.

5. The method of claim 2, wherein the set of criteria includes determining whether a power consumption of the processor is increasing.

6. The method of claim 1, wherein the fan speed setting is set as an initial fan speed setting of a traditional thermal management algorithm.

7. The method of claim 1, wherein the configuration includes a number and type of hard disk drives in the information handling system.

8. The method of claim 7, wherein the thermal resistance is based on a target temperature of the processor, an inlet temperature, and a power consumption of the processor.

9. The method of claim 1, wherein the thermal resistance curve may be predetermined at a manufacturer of the information handling system.

10. The method of claim 1, further comprising handing over control of a cooling fan to a traditional thermal management algorithm.

11. An information handling system, comprising:
    a processor associated with a heat sink;
    a fan to cool the processor; and
    a management controller configured to:
       determine a thermal resistance of the heat sink;
       determine a thermal resistance curve that includes the thermal resistance, wherein the thermal resistance curve is based on a configuration of the information handling system;
       determine a fan speed setting corresponding with the thermal resistance, wherein the fan speed setting is a function of the thermal resistance based on the thermal resistance curve;
       in response to a determination that there is a fan oscillation issue, trigger a control event to determine a target fan speed;
       in response to a determination that a current temperature of the process is equal to a control temperature, determine whether the fan speed setting is greater than a previous fan speed setting by more than a threshold percentage value; and
       in response to a determination that the fan speed setting is greater than the previous fan speed setting, set the fan speed setting equal to the target fan speed.

12. The information handling system of claim 11, wherein the management controller is further configured to determine whether the fan speed setting is equal to the target fan speed.

13. The information handling system of claim 12, wherein the set of criteria includes whether a current temperature of the processor is greater than the control temperature.

14. The information handling system of claim 12, wherein the set of criteria includes determining whether the fan oscillation issue exists.

15. The information handling system of claim 11, further comprising handing over control of a cooling fan to a traditional thermal management algorithm.

16. A non-transitory computer-readable medium including code that when executed by a processor performs a method, the method comprising:
- determining a thermal resistance of a heat sink associated with the processor in an information handling system;
- determining a thermal resistance curve that includes the thermal resistance of the heat sink, wherein the thermal resistance curve is based on a configuration of the information handling system;
- determining a fan speed setting corresponding with the thermal resistance according to the thermal resistance curve, wherein the fan speed setting is a function of the thermal resistance:
- in response to determining that there is a fan oscillation issue, triggering a control event to determine a target fan speed;
- in response to determining that a current temperature of the process is equal to a control temperature, determining whether the fan speed setting is greater than a previous fan speed setting by more than a threshold percentage value: and
- in response to determining that the fan speed setting is greater than the previous fan speed setting, setting a speed of a cooling fan based on the fan speed setting.

17. The non-transitory computer-readable medium of claim 16, further comprising determining whether a set of criteria is met prior to setting the fan speed setting equal to the target fan speed.

18. The non-transitory computer-readable medium of claim 17, wherein the set of criteria includes determining whether the fan oscillation issue exists.

19. The non-transitory computer-readable medium of claim 16, wherein the thermal resistance is based on a target temperature of the processor, an inlet temperature, and a power consumption of the processor.

20. The non-transitory computer-readable medium of claim 16, wherein the configuration further includes a chassis type of the information handling system and a type of the cooling fan.

* * * * *